(12) United States Patent
Hessler et al.

(10) Patent No.: US 9,755,612 B2
(45) Date of Patent: Sep. 5, 2017

(54) METHOD FOR CREATING A RESONATOR

(71) Applicant: The Swatch Group Research and Development Ltd, Marin (CH)

(72) Inventors: Thierry Hessler, St-Aubin (CH); Silvio Dalla Piazza, St-Imier (CH)

(73) Assignee: The Swatch Group Research and Development Ltd, Marin (CH)

( * ) Notice: Subject to any disclaimer, the term of this patent is extended or adjusted under 35 U.S.C. 154(b) by 397 days.

(21) Appl. No.: 14/367,803

(22) PCT Filed: Dec. 20, 2012

(86) PCT No.: PCT/EP2012/076498
§ 371 (c)(1),
(2) Date: Oct. 20, 2014

(87) PCT Pub. No.: WO2013/092920
PCT Pub. Date: Jun. 27, 2013

(65) Prior Publication Data
US 2015/0036346 A1 Feb. 5, 2015

(30) Foreign Application Priority Data

Dec. 22, 2011 (EP) ..................... 11195420

(51) Int. Cl.
*B44C 1/22* (2006.01)
*H03H 9/19* (2006.01)
(Continued)

(52) U.S. Cl.
CPC ............ *H03H 9/19* (2013.01); *B23K 26/0057* (2013.01); *B81C 1/00595* (2013.01); *F21V 17/02* (2013.01); *G04B 17/066* (2013.01); *G04B 17/345* (2013.01); *G04C 3/12* (2013.01); *G04F 5/063* (2013.01); *G04G 17/02* (2013.01); *H01L 41/0475* (2013.01); *H01L 41/332* (2013.01);
(Continued)

(58) Field of Classification Search
CPC ............ B23K 26/0057; B23K 26/0054; B81B 2201/0271; B81B 2203/0118; G04B 17/345; G04B 17/066; H03H 3/00; H03H 3/007
USPC ................ 216/17, 18, 24, 55, 56, 17.18, 87; 438/708, 709, 798
See application file for complete search history.

(56) References Cited

U.S. PATENT DOCUMENTS

| 2002/0139769 A1 | 10/2002 | Helvajian et al. |
| 2003/0235385 A1 | 12/2003 | Taylor et al. |

(Continued)

FOREIGN PATENT DOCUMENTS

| CH | 702 708 | 8/2011 |
| EP | 1 818 736 | 8/2007 |

(Continued)

OTHER PUBLICATIONS

International Search Report Issued Aug. 9, 2013 in PCT/EP12/076498 Filed Dec. 20, 2012.

*Primary Examiner* — Lan Vinh
(74) *Attorney, Agent, or Firm* — Oblon, McClelland, Maier & Neustadt, L.L.P.

(57) ABSTRACT

A method for manufacturing a resonator in a substrate, including: a) modifying a structure of at least one region of the substrate to make the at least one region more selective; b) etching the at least one region to selectively manufacture the resonator.

21 Claims, 6 Drawing Sheets

(51) Int. Cl.
*B81C 1/00* (2006.01)
*G04C 3/12* (2006.01)
*G04F 5/06* (2006.01)
*G04G 17/02* (2006.01)
*G04B 17/06* (2006.01)
*G04B 17/34* (2006.01)
*B23K 26/00* (2014.01)
*F21V 17/02* (2006.01)
*H01L 41/047* (2006.01)
*H01L 41/332* (2013.01)
*H03H 9/215* (2006.01)

(52) U.S. Cl.
CPC ..... *H03H 9/215* (2013.01); *B81B 2201/0271* (2013.01); *B81B 2203/0118* (2013.01); *B81C 2201/0143* (2013.01)

(56) References Cited

U.S. PATENT DOCUMENTS

| | | | |
|---|---|---|---|
| 2004/0094527 | A1 | 5/2004 | Bourne et al. |
| 2005/0194352 | A1* | 9/2005 | Satoh ................. C30B 33/00 216/41 |
| 2006/0276040 | A1* | 12/2006 | Abraham ............ B81C 1/00484 438/689 |
| 2007/0115079 | A1 | 5/2007 | Kubo et al. |
| 2009/0137098 | A1* | 5/2009 | Sakamoto ................. H01S 5/22 438/462 |
| 2009/0194516 | A1* | 8/2009 | Deshi .................... B23K 26/032 219/121.71 |
| 2009/0245030 | A1 | 10/2009 | Buhler et al. |
| 2010/0061192 | A1 | 3/2010 | Hessler et al. |
| 2010/0091473 | A1* | 4/2010 | Kiwitt ...................... H01G 4/40 361/782 |
| 2011/0034031 | A1 | 2/2011 | Kanamori et al. |
| 2011/0103200 | A1 | 5/2011 | Cusin |
| 2011/0127883 | A1 | 6/2011 | Kawaguchi |
| 2011/0304412 | A1* | 12/2011 | Zhang ...................... H03H 3/02 333/187 |
| 2012/0320718 | A1 | 12/2012 | Buehler et al. |

FOREIGN PATENT DOCUMENTS

| | | |
|---|---|---|
| EP | 2 105 807 | 9/2009 |
| EP | 2 317 406 | 5/2011 |
| WO | 02 16070 | 2/2002 |
| WO | 2011 154701 | 12/2011 |

* cited by examiner

METHOD FOR CREATING A RESONATOR

CROSS-REFERENCE TO RELATED APPLICATIONS

This is a National Phase Application in the United States of International Patent Application PCT/EP2012/076498 filed Dec. 20, 2012 which claims priority on European patent Application No. 11195420.2 filed Dec. 22, 2011. The entire disclosures of the above patent applications are hereby incorporated by reference.

The invention concerns a resonator including a body used in deformation as a spiral resonator or a tuning fork.

BACKGROUND OF THE INVENTION

It is known from the prior art that some microtechnical parts made of single crystal or polycrystalline materials, such as resonators, are made by etching. This technique consists in taking the substrate to be etched and depositing a layer of photosensitive resin on top. A mask is placed on the resin and the whole assembly is exposed to light so that the photosensitive resin structure exposed to light is modified. This modified resin is eliminated by the action of a chemical element thus stripping the substrate bare at the places where the resin has been eliminated.

Subsequently, these bare regions of the substrate are chemically etched in order to create hollow portions. The chemical agent is chosen to etch only the material forming the substrate and not the unmodified photosensitive resin. The duration of this chemical etching step determines the dimensions of the hollow portions.

Similarly, it is possible to envisage making microtechnical parts by machining and/or polishing so that a drill or polisher may be used to form said parts.

A first drawback of this chemical etching technique is that it cannot produce hollow portions with straight sides or walls. Indeed, the hollow portions obtained have inclined sides. This means that the surface of the hollow portion varies with depth, i.e. the surface becomes larger or smaller with the depth of the hollow. Generally the surface becomes smaller with depth. This observation means that theoretical calculations have to be adapted to obtain hollow portions with straight sides. Further, this variation in the profile of the hollow portions between theory and practice results in a variation in characteristics.

SUMMARY OF THE INVENTION

It is an object of the invention to overcome the aforecited drawbacks by proposing a manufacturing method for making a component having hollow portions whose sides have an easily achievable inclination.

The invention therefore relates to a method for manufacturing a resonator in a substrate characterized in that it includes the following steps:

a) modifying the structure of at least one region of the substrate in order to make said at least one region more selective;

b) etching said at least one region in order to selectively manufacture said resonator.

An advantage of the present invention is that it makes it possible to create recesses located underneath the surface since the material used is selected to be laser-transparent. This enables the laser to aim at any point on the surface or underneath the surface of the resonator. The material is thus made selective so that the chemical etch that follows is only performed on the material that has undergone modification by the laser. A method is thus obtained which allows complex inner recesses to be created.

Advantageous embodiments of the method of the present invention form the subject of the dependent claims.

In a first advantageous embodiment, the method further includes the step of:

c) releasing the component from said substrate.

In a second advantageous embodiment, the structure of said at least one region is modified by a laser having a femtosecond pulse duration.

In a third advantageous embodiment, the substrate is made of single crystal material.

In another advantageous embodiment, the substrate is made of polycrystalline material.

In another advantageous embodiment, the substrate is made of an amorphous material such as ceramic or glass.

In another advantageous embodiment, the substrate is made of polymer.

In another advantageous embodiment, the component is a resonator including a base from which extend at least two parallel arms each having an upper surface and a lower surface and further including at least one recess made on one of the surfaces of at least one of the at least two parallel arms.

In another advantageous embodiment, said at least one recess takes the form of a groove having at least one vertical side or walls.

In another advantageous embodiment, said resonator includes one groove per arm.

In another advantageous embodiment, said resonator includes a groove on the upper surface of each arm and a groove on the lower surface of each arm.

In another advantageous embodiment, said resonator has two grooves per arm.

In another advantageous embodiment, said resonator includes two grooves on the upper surface of each arm and two grooves on the lower surface of each arm.

In another advantageous embodiment, the method further includes a step consisting of modifying the resonator structure by laser so as to locally modify the refractive index of the material.

In another advantageous embodiment, the component is a resonator including an inertia block coupled to a body formed of a bar coiled around itself to form a spiral, characterized in that said body has at least one hollow portion for locally modifying the rigidity thereof and thus adjusting the resonator frequency and/or regulating the isochronism defect.

In another advantageous embodiment, said at least one hollow portion includes at least two parallel vertical sides or walls.

In another advantageous embodiment, said body is made of quartz or ceramic or glass and includes sides that are locally parallel and vertical over the entire length of said body.

In another advantageous embodiment, said body has a raised outer curve with respect to the other coils formed by the bar coiled on itself.

In another advantageous embodiment, said body transmits and diffuses the light emitted by at least one luminous energy source.

In another advantageous embodiment, the structure of said body is modified by laser so as to locally modify the refractive index of the material.

In another advantageous embodiment, the structure of said body, the refractive index of whose material is modified by laser, is used to form a mirror.

In another advantageous embodiment, the structure of said body, the refractive index of whose material is modified by laser, is used to form a light guide.

The present invention concerns a resonator including a base from which extend at least two parallel arms each having an upper surface and a lower surface, and at least one group of electrodes located on one of the at least two parallel arms to electrically excite said at least two parallel arms, characterized in that it includes at least two straight parallel arms.

In a first advantageous embodiment, one of the surfaces of one of the at least two parallel arms includes at least one recess taking the form of a groove having vertical sides or walls.

In a second advantages embodiment, said resonator includes one groove per arm.

In a third advantageous embodiment, said resonator includes one groove on the upper surface of each arm and one groove on the lower surface of each arm.

In another advantageous embodiment, said resonator has two grooves per arm.

In another advantageous embodiment, said resonator includes two grooves on the upper surface of each arm and two grooves on the lower surface of each arm.

In another advantageous embodiment, the grooves include a projecting portion which optimises the electrical fields, while increasing alignment tolerances.

In another advantageous embodiment, all of the sides of said resonator are straight and vertical.

In another advantageous embodiment, all of the angles of said resonator are right angles.

In another advantageous embodiment, all of the sides of said resonator are straight.

The invention also concerns a resonator including an inertia block coupled to a body formed of a bar coiled on itself to form a spiral, characterized in that said body includes at least one hollow portion for locally modifying the rigidity thereof and thus adjusting the resonator frequency and/or regulating the isochronism defect.

In another advantageous embodiment, said at least one hollow portion includes at least two parallel sides or walls.

In another advantageous embodiment, said body is made of quartz or ceramic or glass and includes locally parallel sides or walls over the entire length of said body.

In an advantageous embodiment, said body has a raised outer curve with respect to the other coils formed by the bar coiled on itself.

In an advantageous embodiment, said body transmits and diffuses the light emitted by at least one luminous energy source.

In an advantageous embodiment, the structure of said body is modified by laser so as to locally modify the refractive index of the material.

In an advantageous embodiment, the structure of said body, the refractive index of whose material is modified by laser, is used to form a mirror.

In an advantageous embodiment, the structure of said body, the refractive index of whose material is modified by laser, is used to form a light guide.

In an advantageous embodiment, the resonator further includes a collet integral with said body, said collet has a hole arranged for mounting said resonator on an arbour, and the hole has at least one side on which at least one groove is arranged so that an intermediate element can be inserted between the collet and the arbour.

BRIEF DESCRIPTION OF THE DRAWINGS

The objects, advantages and features of the method according to the present invention will appear more clearly in the following detailed description of embodiments of the invention, given solely by way of non-limiting example and illustrated in the annexed drawings, in which.

DETAILED DESCRIPTION OF THE INVENTION

Figure 4:
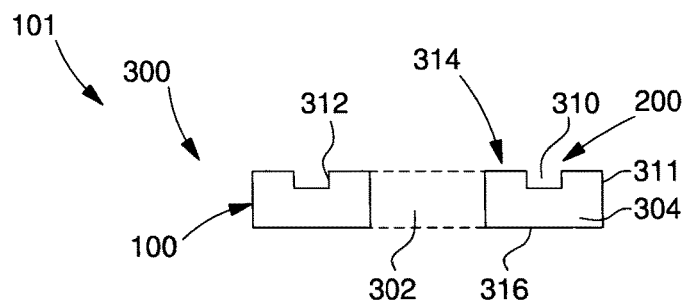
FIGS. 4 and 5 show schematic views of a first embodiment of the resonator according to the present invention.
Figure 5:
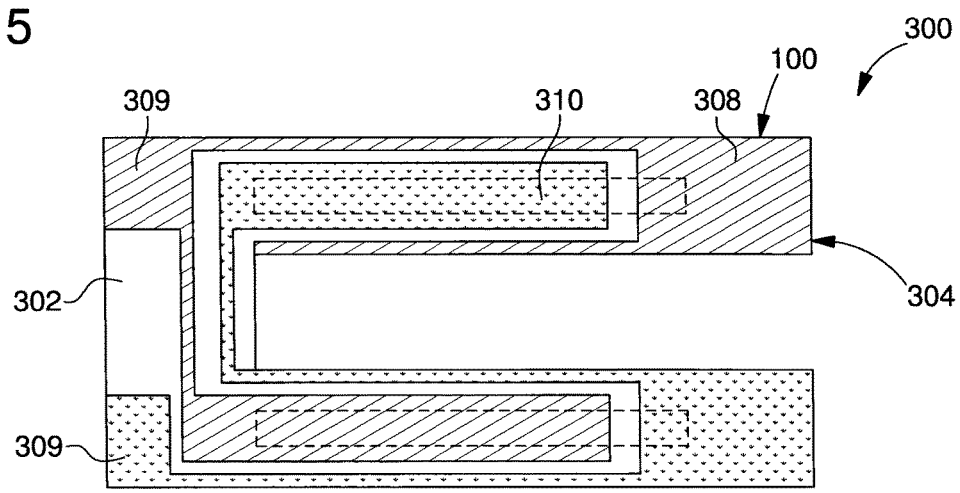

FIGS. 4 and 5 show schematic views of a component according to the present invention.

Figure 1:
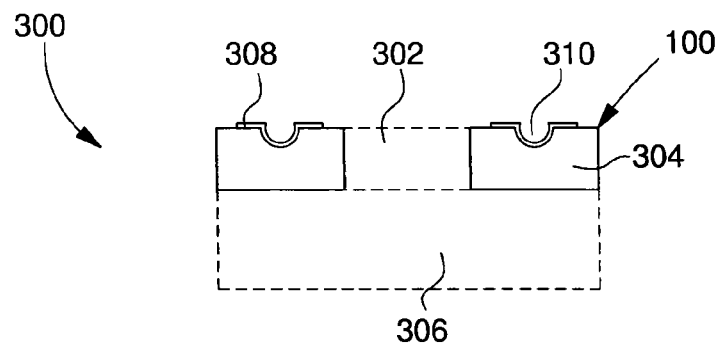
FIGS. 1 and 2 show a schematic front view of a resonator according to the prior art.

The component 101, manufactured in accordance with the method of the present invention, is a resonator 300. A conventional resonator, shown in FIG. 1, includes a body 100 used in deformation. This body 100 takes the form of a base 302 placed on a support base 306 and from which extend at least two parallel arms 304. These two parallel arms 304 carry metallisations which form, on the arms, two groups of electrodes 308 for subjecting them to electrical fields and making them vibrate. Resonator 300 further includes, on base 302, connection pads 309, respectively connected to groups of electrodes 308 as seen in FIG. 5. Each arm 304 includes an upper surface 314 and a lower surface 316. The typical dimensions of this type of resonator 300 are: length 1 mm, width 0.1 mm, thickness 0.1 mm. The resonator also has sides or walls 311.

In order to improve the characteristics of resonator 300, it is known to form recesses 200 taking the form of grooves 310 or channels located on arms 304. These grooves 310 increase the piezoelectric coupling, which decreases the electric power consumption. This decrease in power consumption is a result of the decrease in electrical resistance representing losses in the equivalent circuit of resonator 300.

The present invention proposes to provide a manufacturing method for forming grooves 310 of component 101. In the present case, the emphasis will be placed on the creation of grooves 310 or recesses 200.

Figure 3A:
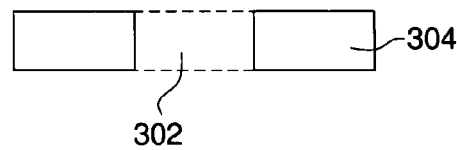
FIGS. 3a to 3e are schematic views of the steps of the method according to the present invention.

In a first step shown in FIG. 3*a*, component 101, which is resonator 300 here, is provided with no grooves 310 formed therein. It is thus understood that resonator 300 is preformed. Resonator 300 is made by the most suitable method according to its constituent material, referred to as the "first material" here, such as for example machining or chemical etching.

Figure 3B:
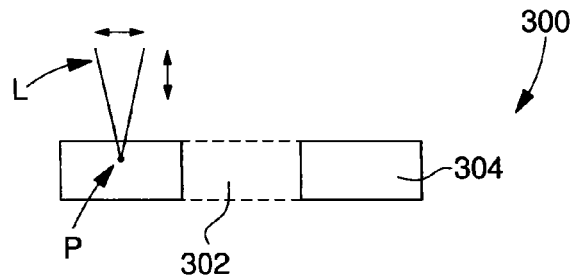
Figure 3C:
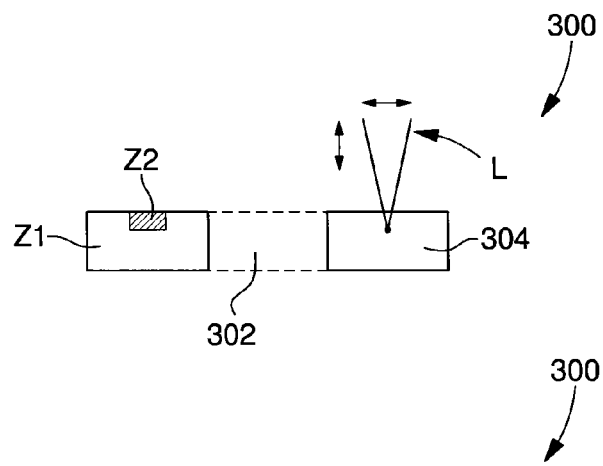
Figure 3D:
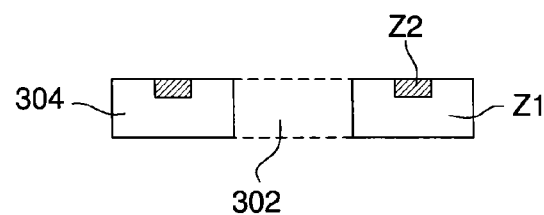

A second step consists in taking a laser (L) having a femtosecond pulse duration here, namely $10^{-15}$ of a second (typically 100 fs). The pulse duration may range from a femtosecond to a picosecond ($10^{-12}$ of a second). This laser (L) is then used to modify the structure of said arm 304 as seen in FIG. 3*b*. To this end, the first material is chosen to be laser-transparent. This means that the focal point (P) of the laser (L) can aim at a point (P) which may be on or underneath the surface of arm 304. For the laser (L) having a femtosecond pulse duration here, the first material may be a single crystal material such as quartz, sapphire or synthetic ruby, or a polycrystalline material, such as polycrystalline ruby, or an amorphous material like glass, such as silica or a ceramic. The focal point (P) is then aimed at resonator 300 on regions located on or underneath the surface of resonator 300. This is all carried out in a predetermined or desired sequence so as to cause a local modification of the structure by multiphoton absorption. Indeed, modification of the structure of the material by multiphoton absorption requires a very high energy density. It is currently only possible to obtain such a high energy density with lasers whose pulse duration is very low, i.e. around a femtosecond or picosecond. These lasers are in fact capable of supplying this energy density at the focal point, i.e. where the energy density is highest. The structure of a first arm 304 is thus modified as seen in FIG. 3*c* and attention is turned to the other arm 304. Resonator 300 is thus obtained, as shown in FIG. 3*d*.

Figure 3E:
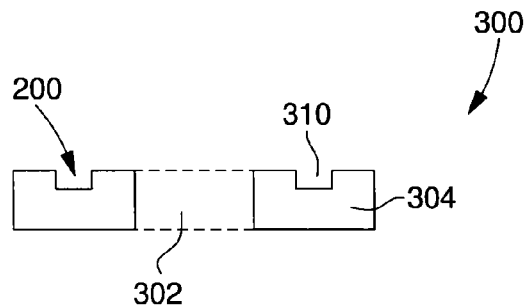

The third step consists in taking a chemical agent. This chemical agent is chosen to allow regions Z1 whose structure has been modified, to be dissolved more quickly than regions Z2 whose structure has not been modified. This means that the etching speed of regions Z1 whose structure has been modified by focal point (P) of the laser (L) is higher than the etching speed of regions Z2 whose structure has not been modified by the laser (L). In fact, the local modification of the structure by the focal point (P) of the femtosecond laser (L) means that it is possible to select a chemical agent which is more reactive to modified regions Z1 than to unmodified regions Z2. Consequently, dipping said resonator for a determined time period in a bath formed of the chemical agent, dissolves all of the regions Z1 whose structure has been modified by focal point (P) of the laser (L). Of course, the dimensions of resonator 300 are calculated to take account of the etch of the chemical agent on the unmodified regions and thus not to excessively dissolve the regions whose structure has not been modified. Resonator 300 is thus obtained, as shown in FIG. 3*e*.

Further, it will be noted that in order for the dissolution of regions Z1 whose structure has been modified to occur, regions Z1 must be accessible to the chemical agent. It is thus understood that at least one surface or at least one region Z1 close to the surface is modified. Indeed, this method makes it possible to create internal structures, but requires that the chemical agent has access to regions Z1 whose structure is modified. If a region Z1 whose structure is modified is at the surface, said chemical agent is able to dissolve modified regions Z1 immediately. However, it is possible to envisage having regions Z1 whose structure has been modified which are not located on the surface but just underneath the surface. The chemical agent then dissolves the few unmodified regions Z2 separating said chemical agent from modified regions Z1 and then dissolves said modified regions. Of course, this means that each recess 200 of resonator 300 must be configured accordingly or be linked. Once all of modified regions Z1 have been dissolved, said resonator is removed from the bath.

A fourth step consist in cleaning said resonator to remove all of the residues of the chemical agent. This stops the chemical reaction for good.

Figure 12:
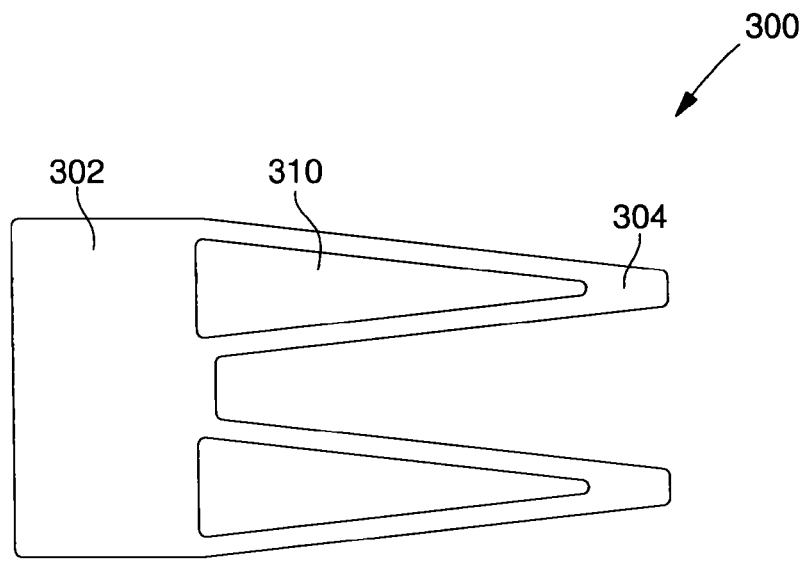
FIG. 12 shows a schematic view of a variant of the first embodiment of the resonator according to the present invention.

The method of the present invention has a twofold advantage. Indeed, the method makes it possible to locally modify the structure of the material of the component so that each place on the surface or underneath the surface of the component can be structurally modified. It is thus possible to structurally modify resonator 300 in complex shapes which will be chemically etched in a precise manner. For example, it is possible to envisage having trapezoidal arms as seen in FIG. 12.

This possibility of complex shapes is then used to make sides or walls 311 and hollow portions 310 having straight vertical sides or walls 312. Indeed, modified regions Z2 are arranged to provide straight sides or walls 312 and because the chemical etching step only acts on the modified regions, the verticality of sides 312 is maintained. It is possible to generalise by stating that the advantage of the method is in retaining the original shapes of recesses 200. The presence of straight vertical sides 312 improves the piezoelectric coupling. Indeed, these sides 312 lead to an increase in the motion capacity of resonator 300. This motion capacity represents the piezoelectric coupling efficiency. For resonator 300 shown in FIG. 4, the increase in piezoelectric coupling gain is around 30%.

In a first implementation seen in FIGS. 4 and 5, the resonator adopts the model of prior art resonator 300, i.e. it has two grooves 310. These two grooves 310 are each located on upper surface 314 of one of arms 304. Each arm 304 thus has one groove 310. Preferably, groove 310 of each arm 304 is placed centrally as shown in FIG. 4. These grooves 310 may thus have the same shape as that of the arms, namely trapezoidal in the case of FIG. 12.

Figure 6:
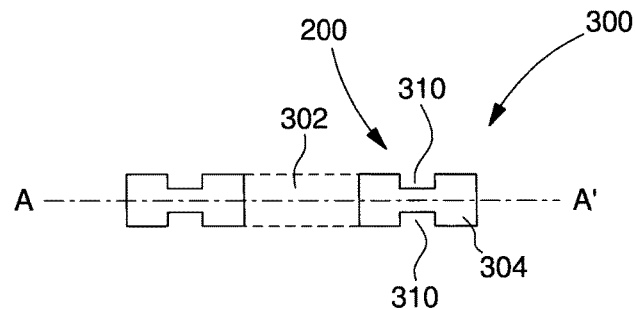
FIG. 6 shows a schematic view of a variant of the first embodiment of the resonator according to the present invention.

In a variant of this first implementation of the invention, each surface 314, 316 of each arm 304 includes one groove 310. It is understood that for a resonator 300 having two arms 304, said resonator 300 has four grooves 310. There is thus one groove 310 on upper surface 314 of each arm 304 and one groove 310 on the lower surface 316 of each arm 304. In this variant, grooves 310 of each arm 304 are opposite with respect to the plane A-A' seen in FIG. 6.

Figure 7:
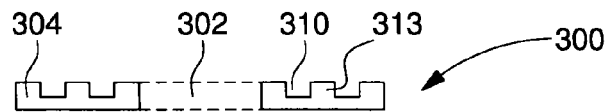
FIG. 7 shows a schematic view of a second embodiment of the resonator according to the present invention.

In a second implementation, there are at least two grooves 310 on one of surfaces 314, 316 of each arm 304, as seen in FIG. 7. Preferably, the at least two grooves 310 of an arm 304 are placed on the same surface 314, 316 as the at least two grooves 310 of the other arm 304. This arrangement optimises the electrical fields in resonator 300.

Figure 8:
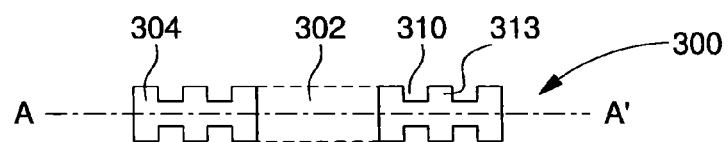
FIGS. 8 and 9 show schematic views of a first variant of the second embodiment of the resonator according to the present invention.

This second implementation may have a variant wherein each surface 314, 316 of each arm 304 includes at least two grooves 310 as seen in FIG. 8.

Figure 9:
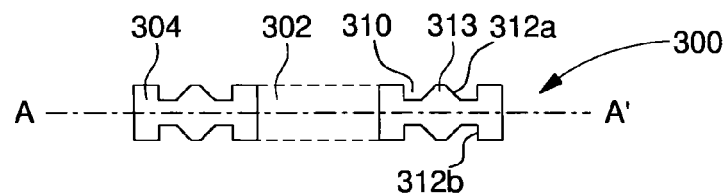

This variant may consist in having two channels each including a straight side or wall 312*b* and an inclined side or wall 312*a*, the two grooves 310 being separated by a central element 313 as seen in FIG. 9. These channels are arranged so that central element 313 is formed by the inclined sides 312a of the two grooves 310. These sides 312a are inclined so that the surface of groove 310 decreases as the depth increases. This arrangement takes advantage of the straight sides 312b of grooves 310 to increase coupling. Further, the fact of having two small grooves 310 instead of one very wide groove 310 means that not too much material is removed from resonator 300 and it is therefore weakened less.

This second implementation and the variant thereof also have the advantage of making it possible to shorten the duration of the method since there is less material to be removed and thus less material to be modified with the laser (L).

However, to achieve this second implementation, it is possible to use the method of the invention in a different manner. Indeed, the invention was described as using a laser (L) having a femtosecond pulse duration for modifying regions of resonator 300 and dissolving them by chemical action. It is also possible to use the laser (L) to cut resonator 300. Laser (L) is used to modify the contours of a region to be eliminated. The chemical etching step is then performed and dissolves the contours of the region to be eliminated. Since the contours of the region are dissolved by the action of the chemical agent, the region to be eliminated is separated from resonator 300. The surface of resonator 300 can then be sculpted and a part thereof removed, for example to make grooves 310, without modifying the structure of the entire part. The time saving is consequently significant.

Figure 10:
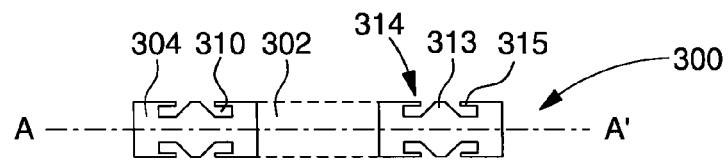
FIG. 10 shows a schematic view of a second variant of the second embodiment of the resonator according to the present invention.

In a second variant seen in FIG. 10, each groove 310 includes a relatively large surface portion 314. These surface portions 314 take the form of a projecting part 315 located at the surface of resonator 300. This projecting part 315 has a rectangular profile and extends towards the centre of the arms. In addition to the advantages of providing an optimised electrical field, this arrangement improves the alignment of the masks. Indeed, in the case of this second implementation, surface portions 314 are used to increase the distance between the lateral electrodes 308 and those placed at the centre of the tuning fork arms. Greater alignment precision or tolerance of the various masks is thus obtained and therefore an increase in the reliability and efficiency of the method. It is thus clear that the resonator, grooves 310 and surface portions 314 are made prior to the step of creating the electrodes. The method according to the present invention makes it possible to use a shading or photosensitive spray masking method.

Figure 11:
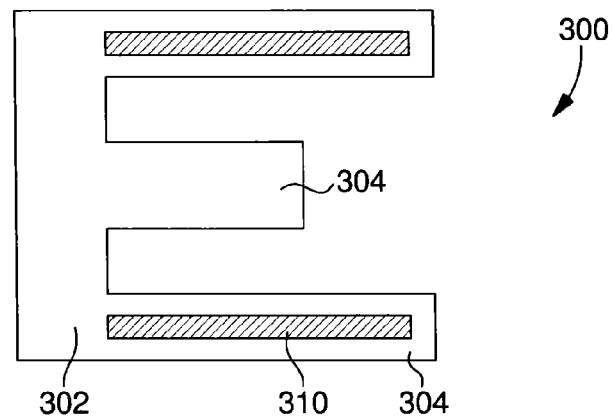
FIG. 11 shows a schematic view of a third embodiment of the resonator according to the present invention.

In a third implementation seen in FIG. 11, it is possible for resonator 300 to include a third arm 304 so that resonator 300 has a similar shape to that of a trident. This third arm 304 is used to secure resonator 300 and more specifically to modify its centre of gravity. Indeed, this third arm 304 is used as a securing point so that it is in contact with support base 306 supporting resonator 300. This arrangement of the third arm 304 which acts as the central arm 304 makes it possible to position the centre of gravity and obtain the best equilibrium of resonator 300. Of course, resonator 300 with three arms 304 may be arranged to have a shape which substantially resembles that of the letter W or the letter M.

Advantageously, the method according to the present invention may be used simply to form the grooves 310 of arms 304 of resonator 300. Indeed, since the method of the present invention is precise and can achieve complex shapes, it is also possible to envisage using the invention to create all or part of resonator 300 from a substrate. This possibility of forming all of resonator 300 using the method of the present invention is advantageous since it shortens the duration of the method. The use of this method makes it possible to perform, in a single step, the step of forming the contours and the step of forming grooves 310 of resonator 300. Of course, it will be understood that this procedure can also be used for the case of a standard resonator 300 with two arms 304. Moreover, it is possible to envisage only using the method of the present invention to make a resonator 300 with two or three arms 304 having no grooves 310 on one and/or the other of arms 304. Another advantage of this technique lies in the possibility of eliminating the residues of the chemical etch between the two arms and, when fins are arranged at the end of arms 304, at the base of the fins.

Figure 2:
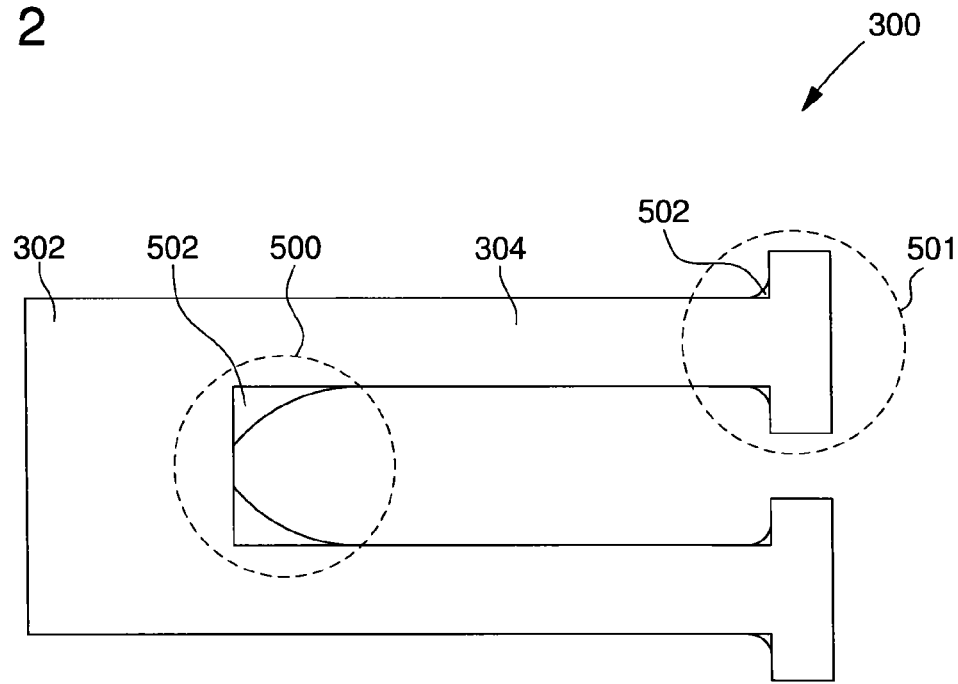

Indeed, an etch by photolithography and chemical etching has the drawback of being imprecise since the chemical etching is not perfectly controlled. Consequently, it is observed that etch residues remain on some portions of a resonator part to be created. For example, it is noted in FIG. 2 showing a resonator made by the photolithography and chemical etching method, that etch residues 502 remain in region 500 located between the two arms 304 or at the base of the fins of the fin region 501. These residues may cause an unbalance in the part since the distribution of material is not necessarily perfect.

Conversely, with the method of the invention, the femtosecond laser illumination of the contours is precise which has the advantage of providing a precise and more easily controllable etch and thus of balancing the arms. It is therefore possible to obtain a resonator 300 wherein all the sides 311, 312 are straight and vertical and wherein all the angles are acute regardless of whether or not they are right angles as seen in FIG. 4.

Figure 13:
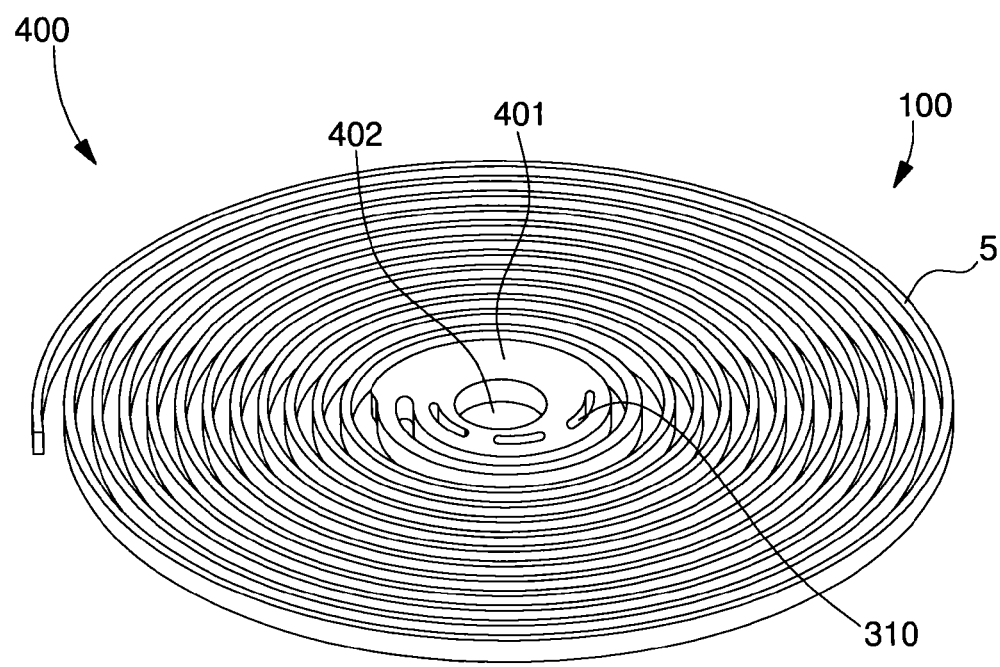
FIG. 13 shows a schematic view of the spiral part of the sprung balance resonator according to the present invention.

It is thus possible to imagine the resonator of the invention taking the form of a sprung balance resonator. This sprung balance resonator includes an inertia block called a balance wheel on which a balance spring is coaxially mounted. The balance wheel includes an annular mass called a felloe held by at least two arms and the balance spring includes a body 100 which takes the form of a bar 5 coiled on itself to form a balance spring 400 as seen in FIG. 13. This type of balance spring 400 may be manufactured using the method of the invention. To achieve this, the contours of balance spring 400 are drawn on a substrate using a laser (L) having a femtosecond or picosecond pulse duration. The chemical etching step then separates balance spring 400 from the rest of the substrate.

The advantage of the method of the present invention is that it makes it possible to precisely create the shape required for balance spring 400. This method also makes it possible to obtain a balance spring having straight sides or walls over the entire length thereof, i.e. to have parallel sides locally. This therefore avoids the overhanging portions in some crystallographic orientations which are present after a conventional etching technique, and thus provides improved balance of the spiral resonator.

Further, owing to the precision of the shapes obtained, the method used makes it possible to create the most complex shapes such as for example a Breguet overcoil. This type of coil differs by having a Phillips terminal curve, i.e. a raised outer curve. A three dimensional balance spring is thus obtained. Thus, with the method of the present invention, it is easy to draw the contours of the Breguet overcoil with the laser (L) having a femtosecond pulse duration.

The method of the present invention also makes it possible to facilitate the adjustment of resonator 300. Indeed, the two great characteristics of a sprung balance resonator are frequency and isochronism, i.e. the capacity of a resonator 300 to have an oscillation duration independent of the amplitude of oscillation and the position of the watch. To adjust the frequency and isochronism of a sprung balance resonator, local modification of the rigidity of the spiral is one solution. To achieve this, the precision of the method of the invention is useful since it makes it possible to form recesses 310 or grooves or channels along the coils of the spiral resonator. These recesses or grooves or channels are made locally so as to locally decrease the rigidity of the resonator and take advantage of the precision of the method. These recesses 310 have at least two straight parallel sides, but it is possible for the sides to be in parallel pairs. The sides of the recesses may also be locally parallel. The method therefore makes it possible to create the contours and recesses 310 of the spiral resonator in the same single step, thereby simplifying the manufacture of the spiral resonator.

Figure 14:
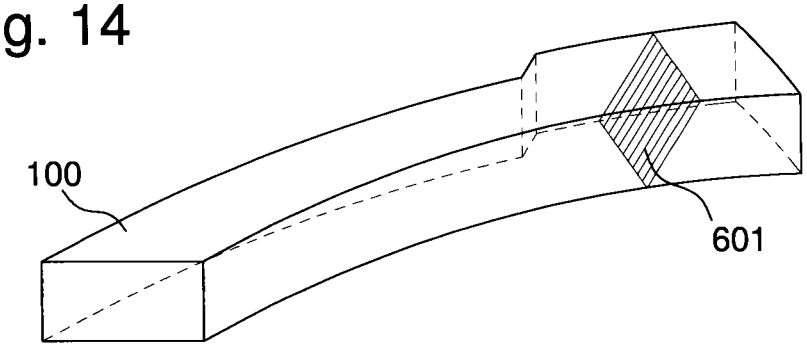
FIGS. 14 and 15 shows schematic views of variants of the spiral part of the sprung balance resonator according to the present invention.

In a variant, it is possible for the spiral, made of a laser-transparent material, to be illuminated. To achieve this, a light device is placed in proximity to a location on balance spring 400 preferably at one end thereof. The light emitted by the device is then diffused in the balance spring. Since the method of the invention allows the inner structure of body 100 of the spiral resonator to be modified by the laser, this thus makes it possible to locally modify the refractive index of the material. This feature makes it possible to produce inner structures 600. These inner structures 600 may be "conventional" mirrors 601, or use two or three-dimensional crystal photonic systems as seen in FIG. 14.

Figure 15:
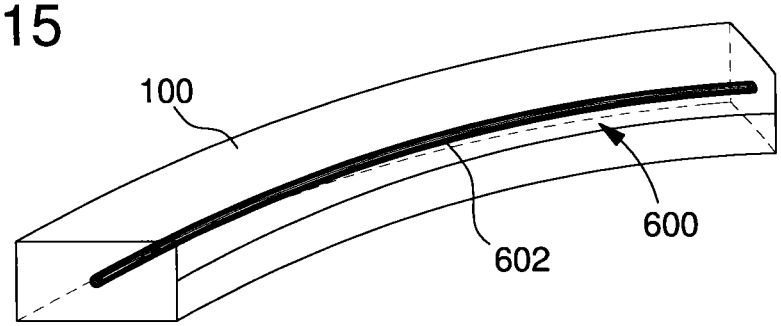

This modification of the refractive index of the material may be achieved so as to form a light guide 602 seen in FIG. 15. To achieve this, the material is modified so as to form a channel of square or circular cross-section which may cover or all part of the coil.

Figure 16:
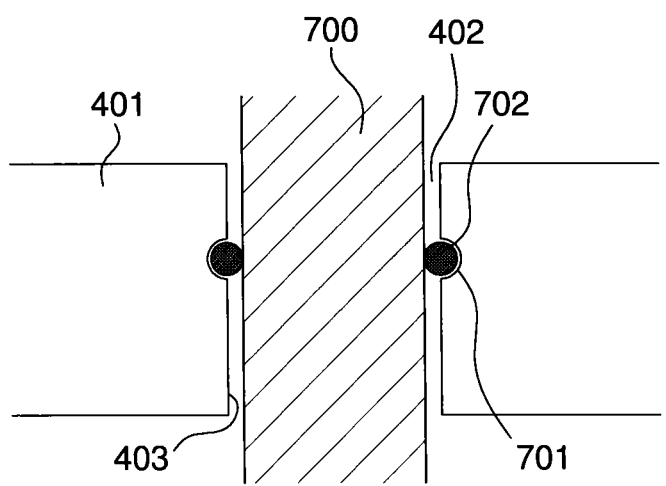
FIG. 16 shows a schematic view of the fastening part of the sprung balance resonator according to the present invention.

Likewise, it is possible to envisage using the laser illumination and etching method to improve the securing of said spiral resonator as seen in FIG. 16. Indeed, a spiral resonator 400 is secured to an arbour 700 via a collet 401 which may be integral with the body 100 coiled to form a coil. This collet is located at the inner end of body 100 so as to be at the centre of spiral resonator 400. Collet 401 includes a through hole 402 which may be circular or rectangular and into which arbour 700 is inserted. To improve securing, at least one recess or one groove 701 may be made on sides 403 of hole 402 so that an intermediate element 702 can be inserted between the collet and the arbour when said spiral resonator is secured. This intermediate element may be metallic or take the form of an O-ring joint.

It will be clear that various alterations and/or improvements and/or combinations evident to those skilled in the art may be made to the various embodiments of the invention set out above without departing from the scope of the invention defined by the annexed claims.

The invention claimed is:

1. A method for manufacturing a resonator in a substrate, the method comprising:
   modifying a structure of at least one region of the substrate by multiphoton absorption of a laser in order to make said at least one region more selective; and
   etching said at least one region in order to selectively manufacture said resonator,
   wherein a pulse duration of the laser ranges from a femtosecond to a picosecond.

2. The manufacturing method according to claim 1, further comprising:
   releasing the resonator from said substrate.

3. The manufacturing method according to claim 1, wherein the substrate is made of a material transparent to a wavelength of the laser.

4. The manufacturing method according to claim 3, wherein the substrate is made of single crystal material.

5. The manufacturing method according to claim 3, wherein the substrate is made of polycrystalline material.

6. The manufacturing method according to claim 3, wherein the substrate is made of polymer.

7. The manufacturing method according to claim 3, wherein the substrate is made of an amorphous material or a ceramic or glass.

8. The method according to claim 1, wherein the resonator includes a base from which extend at least two parallel arms each having an upper surface and a lower surface and further includes at least one recess made on one of the surfaces of at least one of the at least two parallel arms.

9. The method according to claim 8, wherein said at least one recess takes a form of a groove having at least one vertical side.

10. The method according to claim 8, wherein said resonator includes one groove per arm.

11. The method according to claim 8, wherein said resonator includes one groove on the upper surface of each arm and one groove on the lower surface of each arm.

12. The method according to claim 8, wherein said resonator includes two grooves per arm.

13. The method according to claim 8, wherein said resonator includes two grooves on the upper surface of each arm and two grooves on the lower surface of each arm.

14. The method according to claim 1, wherein the resonator includes an inertia block coupled to a body formed of a bar coiled on itself to form a spiral, wherein said body has at least one hollow portion to locally modify rigidity thereof and thus adjust a resonator frequency and/or regulate isochronism defect.

15. The method according to claim 14, wherein said at least one hollow portion includes at least two parallel vertical sides.

16. The method according to claim 14, wherein said body is made of quartz or ceramic or glass and includes sides that are locally parallel and vertical over an entire length of said body.

17. The method according to claim 14, wherein said body includes a raised outer coil with respect to a plane of other coils formed by the bar coiled on itself.

18. The method according to claim 14, wherein said body transmits and diffuses light emitted by at least one luminous energy source.

19. The method according to claim 18, wherein the structure of said body is modified by laser so as to locally modify a refractive index of a material of the body.

20. The method according to claim 18, wherein a refractive index of a material of the body is modified by laser and the structure of said body is used to form a mirror.

21. The method according to claim 18, wherein a refractive index of a material of the body is modified by the laser and the structure of said body is used to form a light guide.

* * * * *